(12) United States Patent
He et al.

(10) Patent No.: US 12,165,688 B2
(45) Date of Patent: Dec. 10, 2024

(54) FLASH MEMORY DEVICES INCLUDING DRAM

(71) Applicant: MICRON TECHNOLOGY, INC., Boise, ID (US)

(72) Inventors: Yankang He, Mountain View, CA (US); Walter Di Francesco, Silvi (IT); Luca Nubile, Sulmona (IT); Chang Siau, Saratoga, CA (US)

(73) Assignee: Micron Technology, Inc., Boise, ID (US)

( * ) Notice: Subject to any disclaimer, the term of this patent is extended or adjusted under 35 U.S.C. 154(b) by 162 days.

(21) Appl. No.: 17/747,183

(22) Filed: May 18, 2022

(65) Prior Publication Data

US 2023/0377626 A1 Nov. 23, 2023

(51) Int. Cl.
*G11C 11/406* (2006.01)
*G11C 11/4072* (2006.01)
*G11C 11/4094* (2006.01)

(52) U.S. Cl.
CPC ... *G11C 11/40611* (2013.01); *G11C 11/40622* (2013.01); *G11C 11/4072* (2013.01); *G11C 11/4094* (2013.01)

(58) Field of Classification Search
CPC ......... G11C 11/40611; G11C 11/40622; G11C 11/4072; G11C 11/4094; G11C 11/4063; G11C 2207/2236; G11C 11/4091; G11C 11/005; G11C 11/40615
See application file for complete search history.

(56) References Cited

U.S. PATENT DOCUMENTS

| | | | |
|---|---|---|---|
| 2005/0204091 A1* | 9/2005 | Kilbuck | G11C 7/10 711/103 |
| 2017/0010817 A1* | 1/2017 | Lim | G11C 14/0018 |
| 2018/0329640 A1* | 11/2018 | Roohparvar | G06F 13/4068 |
| 2019/0278516 A1* | 9/2019 | Rowley | G06F 3/0659 |

* cited by examiner

*Primary Examiner* — Jerome Leboeuf
(74) *Attorney, Agent, or Firm* — Dicke, Billig & Czaja, PLLC

(57) ABSTRACT

One example of a memory device includes an array of flash memory cells, an array of Dynamic Random Access Memory (DRAM) memory cells, and a controller. The controller is configured to execute first instructions stored in the array of DRAM memory cells to access the array of flash memory cells.

24 Claims, 10 Drawing Sheets

FLASH MEMORY DEVICES INCLUDING DRAM

TECHNICAL FIELD

The present disclosure relates generally to memory and, in particular, in one or more embodiments, the present disclosure relates to instruction dynamic random access memory (DRAM) within flash memory devices.

BACKGROUND

Memories (e.g., memory devices) are typically provided as internal, semiconductor, integrated circuit devices in computers or other electronic devices. There are many different types of memory including random-access memory (RAM), read only memory (ROM), dynamic random access memory (DRAM), synchronous dynamic random access memory (SDRAM), and flash memory.

Flash memory has developed into a popular source of non-volatile memory for a wide range of electronic applications. Flash memory typically use a one-transistor memory cell that allows for high memory densities, high reliability, and low power consumption. Changes in threshold voltage (Vt) of the memory cells, through programming (which is often referred to as writing) of charge storage structures (e.g., floating gates or charge traps) or other physical phenomena (e.g., phase change or polarization), determine the data state (e.g., data value) of each memory cell. Common uses for flash memory and other non-volatile memory include personal computers, personal digital assistants (PDAs), digital cameras, digital media players, digital recorders, games, appliances, vehicles, wireless devices, mobile telephones, and removable memory modules, and the uses for non-volatile memory continue to expand.

A NAND flash memory is a common type of flash memory device, so called for the logical form in which the basic memory cell configuration is arranged. Typically, the array of memory cells for NAND flash memory is arranged such that the control gate of each memory cell of a row of the array is connected together to form an access line, such as a word line. Columns of the array include strings (often termed NAND strings) of memory cells connected together in series between a pair of select gates, e.g., a source select transistor and a drain select transistor. Each source select transistor may be connected to a source, while each drain select transistor may be connected to a data line, such as column bit line. Variations using more than one select gate between a string of memory cells and the source, and/or between the string of memory cells and the data line, are known.

Flash memory may include ROM to store computer-readable executable instructions (e.g., firmware) for operating the flash memory. In addition, flash memory may include content-addressable memory (CAM) and static random access memory (SRAM) to store a limited set of firmware instructions that may be used to replace firmware instructions stored in the ROM.

DETAILED DESCRIPTION

Figure 1A:
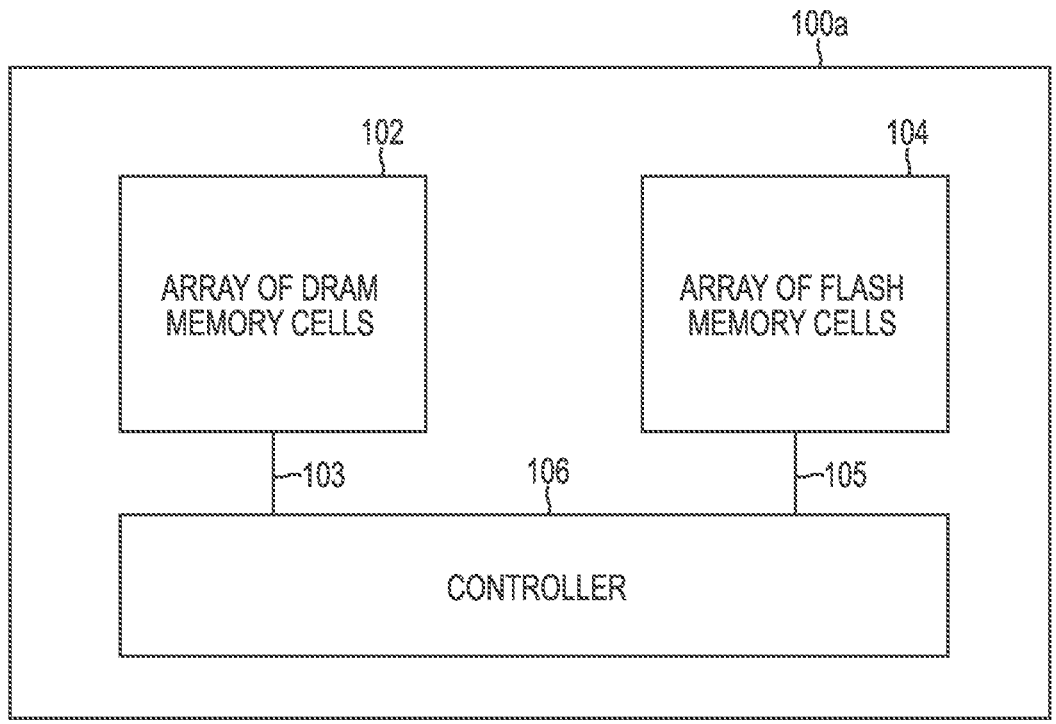
FIG. 1A is a simplified block diagram illustrating a memory device according to an embodiment.

In the following detailed description, reference is made to the accompanying drawings that form a part hereof, and in which is shown, by way of illustration, specific embodiments. In the drawings, like reference numerals describe substantially similar components throughout the several views. Other embodiments may be utilized and structural, logical and electrical changes may be made without departing from the scope of the present disclosure. The following detailed description is, therefore, not to be taken in a limiting sense.

Ranges might be expressed herein as from "about" one particular value, and/or to "about" another particular value. When such a range is expressed, another embodiment might include from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

In flash memory devices including read only memory (ROM) to store computer-readable executable instructions (e.g., firmware), flexibility is limited and there may be a long turnaround time if changes are needed to the firmware to fix bugs or to improve performance. Content-addressable memory (CAM) and static random access memory (SRAM) may be used to store a limited set of firmware instructions that may be used to replace firmware instructions stored in the ROM, but the capacity to support updates to the firmware after the ROM is programmed in silicon is typically small. In addition, SRAM is about ten times the size as ROM, thus SRAM has a relatively high cost compared to ROM. Dynamic random access memory (DRAM) is comparable in area to ROM, is comparable/slightly slower in performance compared to ROM, and is easily updated.

Accordingly, disclosed herein are flash memory devices including embedded DRAM memory cells, which are post-silicon programmable and lower cost than SRAM memory cells, to replace the majority of the instruction ROM, as well as the instruction CAM and the instruction SRAM, to store firmware instructions. A small portion of the instruction ROM may be kept to support limited operations, such as memory device initialization, power on reset (POR) trim loading, special test modes, etc. Each time the memory device is initialized (e.g., powered up), the firmware instructions might be loaded into the DRAM and all firmware algorithms might be executed by loading the instructions from the DRAM. By using DRAM, updates to the firmware instructions to fix bugs or to improve performance might be simplified compared to updating the firmware instructions in ROM. Also disclosed herein is refresh conflict management to minimize and/or avoid any potential performance penalties caused by conflicts between periodic DRAM refreshes and firmware instruction execution.

FIG. 1A is a simplified block diagram illustrating a memory device 100a according to an embodiment. Memory device 100a includes an array of DRAM memory cells 102, an array of flash memory cells 104, and a controller 106. The controller 106 is communicatively coupled to the array of DRAM memory cells 102 through a communication path 103 and to the array of flash memory cells 104 through a communication path 105. The controller 106 might be configured to execute first instructions stored in the array of DRAM memory cells 102 to access the array of flash memory cells 104 (e.g., for read and/or write operations and/or erase operations). As described in more detail below with reference to FIGS. 10A-11B, controller 106 might enable a refresh of the array of DRAM memory cells 102 to preserve the content of the array of DRAM memory cells.

In one example, the array of flash memory cells 104 might include a NAND memory array. In other examples, the array of flash memory cells 104 might include a NOR memory array. Controller 106 might include a microcontroller, a control unit (CU), a central processing unit (CPU), or other suitable logic circuitry for loading and executing instructions (e.g., firmware instructions) stored in the array of DRAM memory cells 102. As described in more detail below with reference to FIGS. 10A and 11A, the description may also apply to memory devices with multiple controllers and multiple arrays of DRAM memory cells. In such examples, the firmware instructions may be distributed (e.g., stored) across multiple arrays of DRAM memory cells and the firmware instructions may be distributed (e.g., executed by) across multiple controllers.

Figure 1B:
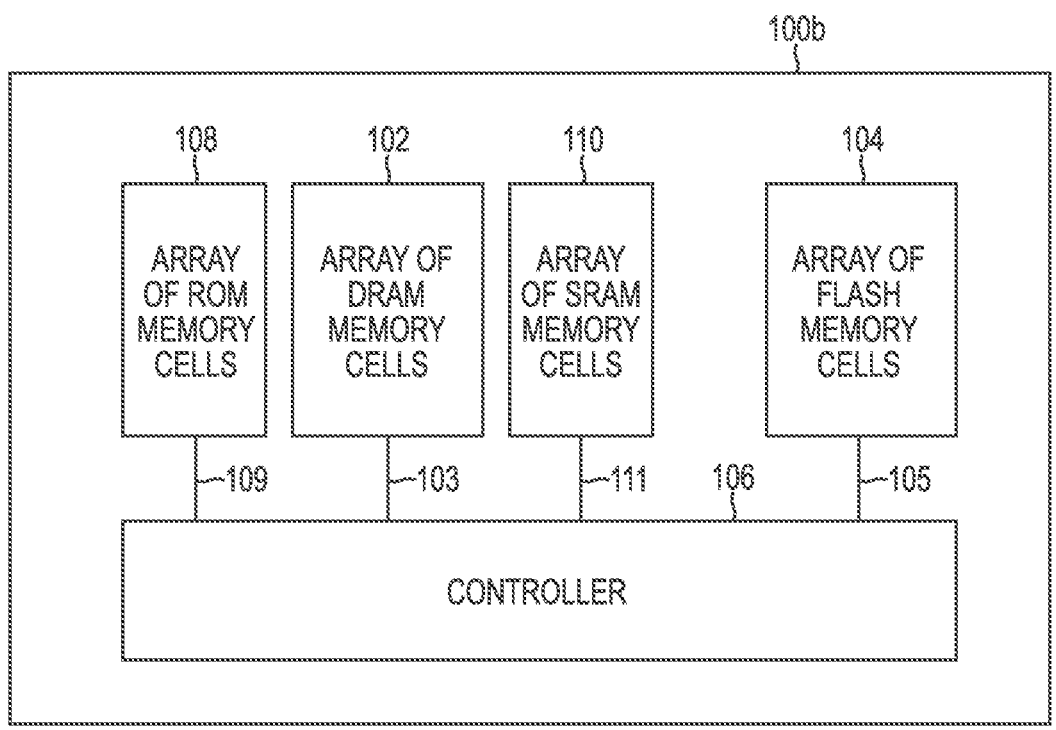
FIG. 1B is a simplified block diagram illustrating another memory device according to an embodiment.

FIG. 1B is a simplified block diagram illustrating another memory device 100b according to an embodiment. Memory device 100b includes an array of DRAM memory cells 102, an array of flash memory cells 104, and a controller 106 as previously described and illustrated with reference to FIG. 1A. In addition, memory device 100b includes an array of ROM memory cells 108 and an array of SRAM memory cells 110. Controller 106 is communicatively coupled to the array of ROM memory cells 108 through a communication path 109 and to the array of SRAM memory cells 110 through a communication path 111.

As previously described, the controller 106 might be configured to execute first instructions stored in the array of DRAM memory cells 102 to access the array of flash memory cells 104 (e.g., for read and/or write operations and/or erase operations). Since the array of DRAM memory cells 102 is a volatile memory, the first instructions might be stored in a reserved portion of the non-volatile array of flash memory cells 104. Upon initialization (e.g., power up) of the memory device 100b, the controller 106 might be configured to execute second instructions (e.g., a limited subset of the firmware instructions) stored in the array of ROM memory cells 108 to copy the first instructions stored in the array of flash memory cells 104 and load/store the first instructions in the array of DRAM memory cells 102. The array of ROM memory cells 108 might also store instructions for POR trim loading and special test modes, etc. The array of ROM memory cells 108 might be much smaller than the array of DRAM memory cells 102.

The first instructions may be updated for bug fixes and/or performance improvements. In one example, the controller 106 might be configured to update the first instructions stored in the array of flash memory cells 104. In this case, upon initialization of the memory device 100b, the controller 106 might be configured to execute the second instructions stored in the array of ROM memory cells 108 to copy the updated first instructions stored in the array of flash memory cells 104 to the array of DRAM memory cells 102. The controller 106 might update the first instructions stored in the array of flash memory cells 104 by receiving the updated first instructions from a processor (e.g., 140 of FIG. 2) external to the memory device 100b and writing the updated first instructions to the reserved portion of the array of flash memory cells 104.

The array of SRAM memory cells 110 may store configuration data, such as dynamic trims and working variables. Since the array of SRAM memory cells 110 is a volatile memory, the configuration data might be stored in the reserved portion of the non-volatile array of flash memory cells 104. Upon initialization of the memory device 100b, the controller 106 might be configured to execute the second instructions stored in the array of ROM memory cells 108 to copy the configuration data stored in the array of flash memory cells 104 to the array of SRAM memory cells 110.

Figure 2:
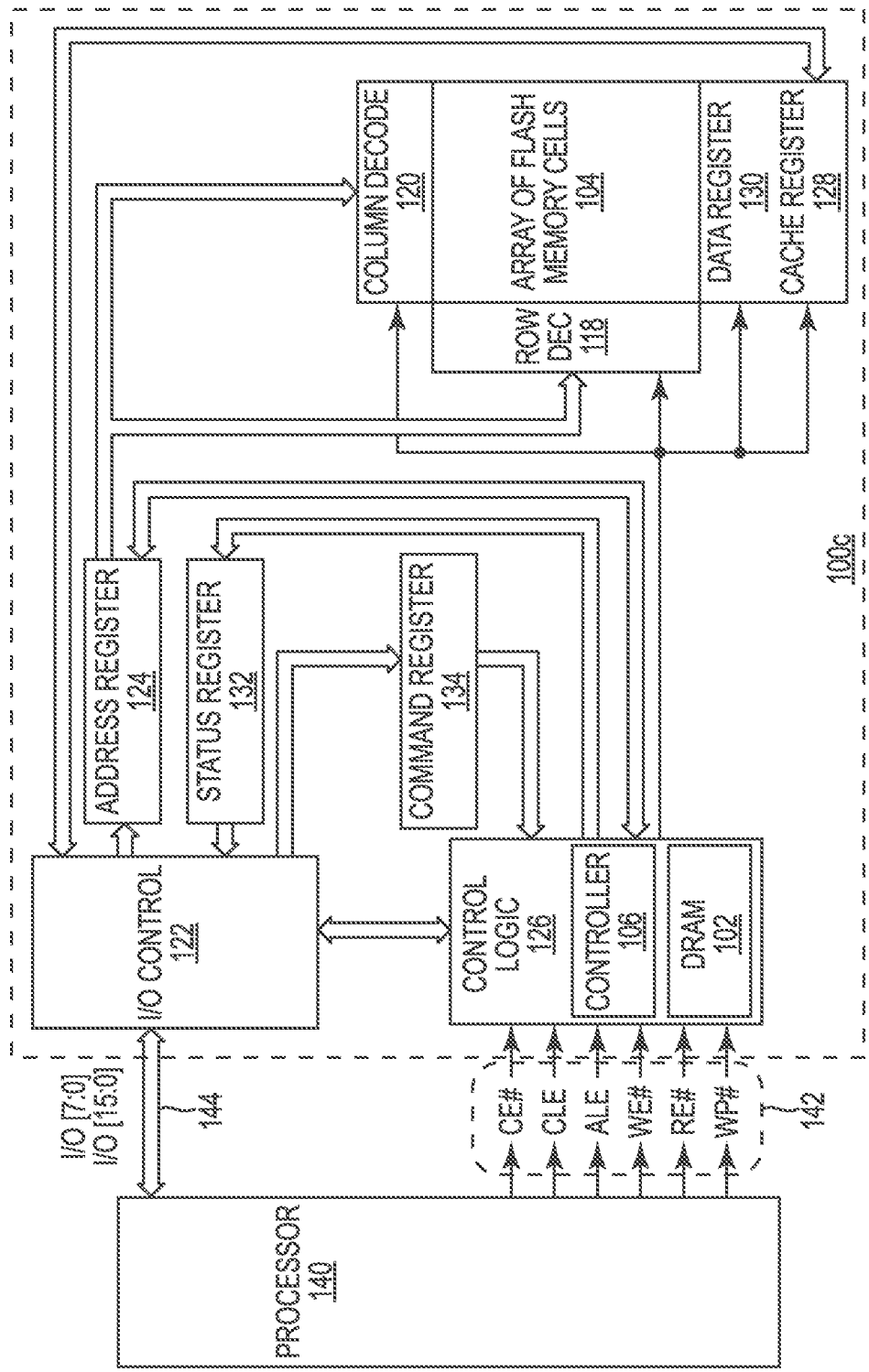
FIG. 2 is a simplified block diagram of a memory in communication with a processor as part of an electronic system, according to an embodiment.

FIG. 2 is a simplified block diagram of a first apparatus, in the form of a memory (e.g., memory device) 100c, in communication with a second apparatus, in the form of a processor 140, as part of a third apparatus, in the form of an electronic system, according to an embodiment. Some examples of electronic systems include personal computers, personal digital assistants (PDAs), digital cameras, digital media players, digital recorders, games, appliances, vehicles, wireless devices, mobile telephones and the like. The processor 140, e.g., a controller external to the memory device 100c, might be a memory controller or other external host device.

Memory device 100c includes an array of flash memory cells 104 that might be logically arranged in rows and columns. Memory cells of a logical row are typically connected to the same access line (commonly referred to as a word line) while memory cells of a logical column are typically selectively connected to the same data line (commonly referred to as a bit line). A single access line might be associated with more than one logical row of memory cells and a single data line might be associated with more than one logical column. Memory cells (not shown in FIG. 1) of at least a portion of the array of flash memory cells 104 are capable of being programmed to one of at least two target data states. The memory cells might be grouped into blocks of memory cells, and the blocks of memory cells might be grouped into memory planes, such as 4, 6, or 8 memory planes.

A row decode circuitry 118 and a column decode circuitry 120 are provided to decode address signals. Address signals are received and decoded to access the array of flash memory cells 104. Memory device 100c also includes input/output (I/O) control circuitry 122 to manage input of commands, addresses and data to the memory device 100c as well as output of data and status information from the memory device 100c. An address register 124 is in communication with I/O control circuitry 122 and row decode circuitry 118 and column decode circuitry 120 to latch the address signals prior to decoding. A command register 134 is in communication with I/O control circuitry 122 and control logic 126 to latch incoming commands.

A controller 106 of the control logic 126 internal to the memory device 100c controls access to the array of flash memory cells 104 in response to the commands and may generate status information for the external processor 140, i.e., control logic 126 is configured to perform access operations (e.g., sensing operations [which might include read operations and verify operations], programming operations and/or erase operations) on the array of flash memory cells 104. The control logic 126 is in communication with row decode circuitry 118 and column decode circuitry 120 to control the row decode circuitry 118 and column decode circuitry 120 in response to the addresses. The control logic 126 might include DRAM 102 which might represent computer-usable memory for storing computer-readable instructions. For some embodiments, the DRAM 102 might store firmware.

Control logic 126 might also be in communication with a cache register 128. Cache register 128 latches data, either incoming or outgoing, as directed by control logic 126 to temporarily store data while the array of flash memory cells 104 is busy writing or reading, respectively, other data. During a programming operation (e.g., write operation), data might be passed from the cache register 128 to the data register 130 for transfer to the array of flash memory cells 104; then new data might be latched in the cache register 128 from the I/O control circuitry 122. During a read operation, data might be passed from the cache register 128 to the I/O control circuitry 122 for output to the external processor 140; then new data might be passed from the data register 130 to the cache register 128. The cache register 128 and/or the data register 130 might form (e.g., might form a portion of) a page buffer of the memory device 100c. A page buffer might further include sensing devices (not shown in FIG. 2) to sense a data state of a memory cell of the array of flash memory cells 104, e.g., by sensing a state of a data line connected to that memory cell. A status register 132 might be in communication with I/O control circuitry 122 and control logic 126 to latch the status information for output to the processor 140.

Memory device 100c receives control signals at control logic 126 from processor 140 over a control link 142. The control signals might include a chip enable CE #, a command latch enable CLE, an address latch enable ALE, a write enable WE #, a read enable RE #, and a write protect WP #. Additional or alternative control signals (not shown) might be further received over control link 142 depending upon the nature of the memory device 100c. Memory device 100c receives command signals (which represent commands), address signals (which represent addresses), and data signals (which represent data) from processor 140 over a multiplexed input/output (I/O) bus 144 and outputs data to processor 140 over I/O bus 144.

For example, the commands might be received over input/output (I/O) pins [7:0] of I/O bus 144 at I/O control circuitry 122 and might then be written into command register 134. The addresses might be received over input/output (I/O) pins [7:0] of I/O bus 144 at I/O control circuitry 122 and might then be written into address register 124. The data might be received over input/output (I/O) pins [7:0] for an 8-bit device or input/output (I/O) pins [15:0] for a 16-bit device at I/O control circuitry 122 and then might be written into cache register 128. The data might be subsequently written into data register 130 for programming the array of flash memory cells 104. For another embodiment, cache register 128 might be omitted, and the data might be written directly into data register 130. Data might also be output over input/output (I/O) pins [7:0] for an 8-bit device or input/output (I/O) pins [15:0] for a 16-bit device. Although reference might be made to I/O pins, they might include any conductive nodes providing for electrical connection to the memory device 100c by an external device (e.g., processor 140), such as conductive pads or conductive bumps as are commonly used.

It will be appreciated by those skilled in the art that additional circuitry and signals can be provided, and that the memory device 100c of FIG. 2 has been simplified. It should be recognized that the functionality of the various block components described with reference to FIG. 2 might not necessarily be segregated to distinct components or component portions of an integrated circuit device. For example, a single component or component portion of an integrated circuit device could be adapted to perform the functionality of more than one block component of FIG. 2. Alternatively, one or more components or component portions of an integrated circuit device could be combined to perform the functionality of a single block component of FIG. 2.

Additionally, while specific I/O pins are described in accordance with popular conventions for receipt and output of the various signals, it is noted that other combinations or numbers of I/O pins (or other I/O node structures) might be used in the various embodiments.

Figure 3:
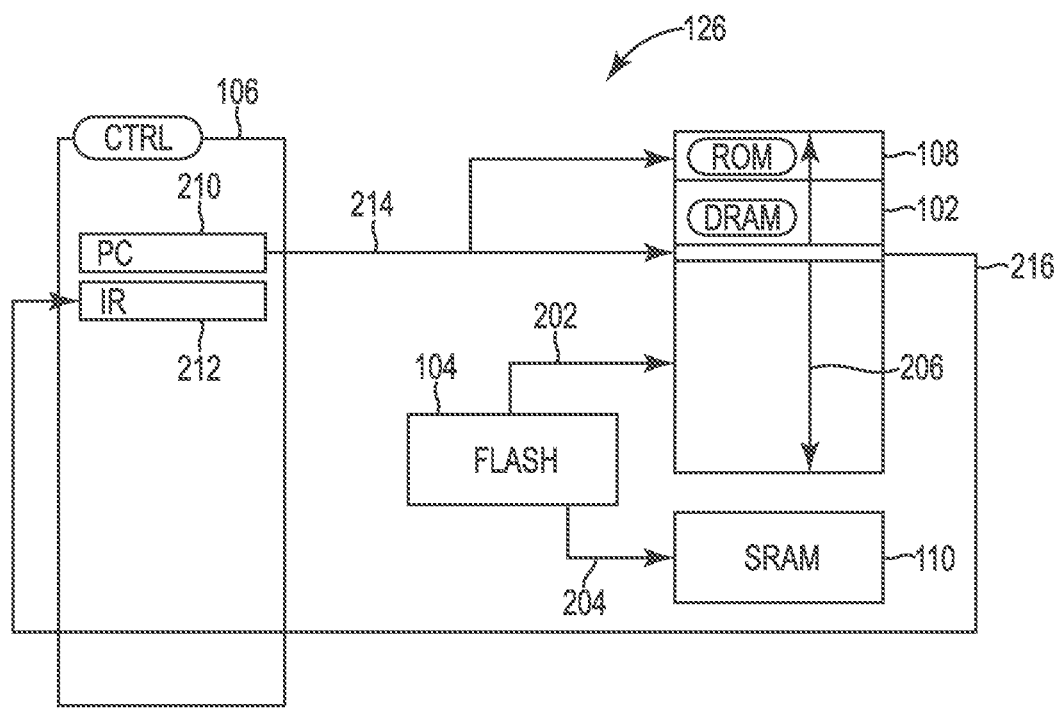
FIG. 3 is a block diagram illustrating control logic of a memory device according to an embodiment.

FIG. 3 is a block diagram illustrating the operation of control logic 126 of FIG. 2 according to an embodiment. In this embodiment, control logic 126 includes a controller 106, an array of DRAM memory cells 102, an array of ROM memory cells 108, and an array of SRAM memory cells 110. Upon initialization (e.g., power up) of the memory device, instruction code (e.g., firmware) stored in the array of flash memory cells 104 is loaded into the array of DRAM memory cells 102 as indicated at 202. Also upon initialization, configuration data stored in the array of flash memory cells 104 is loaded into the array of SRAM memory cells 110 as indicated at 204. The configuration data may include dynamic trims and/or working variables for the instruction code stored in the array of DRAM memory cells 102.

The instruction set (ISET) address space includes the array of ROM memory cells 108 and the array of DRAM memory cells 102 as indicated at 206. In one example, the array of DRAM memory cells 102 might provide at least 90% of the total ISET address space 206, while the array of ROM memory cells 108 might provide the remainder of the ISET address space 206. Compared to typical ISET address space that is comprised entirely of non-programmable ROM memory cells and/or higher cost SRAM memory cells, ISET address space comprised mostly of DRAM memory cells might have a lower cost and enable easier updating of the instruction code. In addition, all the instruction code may be updated since updates to the instruction code are not limited to the size of CAM and/or SRAM.

The controller 106 includes a program counter (PC) 210 and an instruction register (IR) 212. The program counter 210 might manage the memory address of the ISET address space of the array of ROM memory cells 108 and the array of DRAM memory cells 102. The program counter 210 might be used to address the instruction code to be executed next as indicated at 214. The addressed instruction code might then be output from the array of ROM memory cells 108 or the array of DRAM memory cells 102 as indicated at 216. The output from the array of ROM memory cells 108 or the array of DRAM memory cells 102 may then be loaded into the instruction register 212 for execution by the controller 106.

Figure 4:
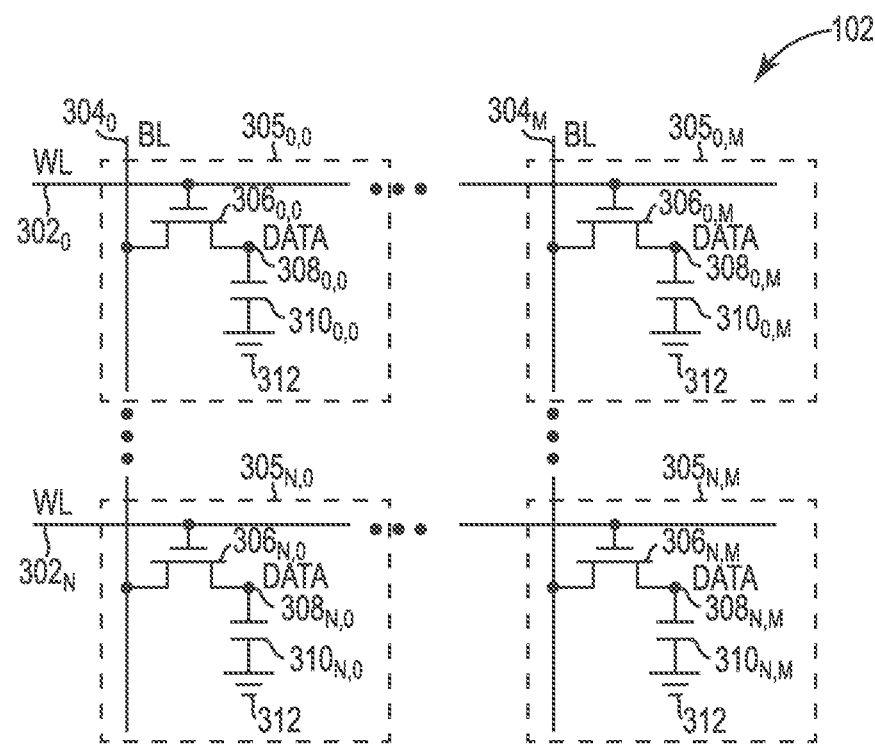
FIG. 4 is a schematic diagram illustrating an array of dynamic random access memory (DRAM) memory cells according to an embodiment.

FIG. 4 is a schematic diagram illustrating an array of DRAM memory cells 102 according to an embodiment. The array of DRAM memory cells 102 includes a plurality of word lines $302_0$ to $302_N$, a plurality of bit lines $304_0$ to $304_M$, and a plurality of respective memory cells $305_{0,0}$ to $305_{N,M}$ at the intersection of each respective word line $302_0$ to $302_N$ and respective bit line $304_0$ to $304_M$, where "N" is any suitable number of word lines and "M" is any suitable number of bit lines. Each memory cell $305_{0,0}$ to $305_{N,M}$ includes a respective transistor $306_{0,0}$ to $306_{N,M}$ and a respective storage capacitor $310_{0,0}$ to $310_{N,M}$. A gate of each transistor $306_{0,0}$ to $306_{N,M}$ might be electrically coupled to the respective word line $302_0$ to $302_N$, a source of each transistor $306_{0,0}$ to $306_{N,M}$ might be electrically coupled to the respective bit line $304_0$ to $304_M$, and a drain of each transistor $306_{0,0}$ to $306_{N,M}$ might be electrically coupled to one side of the respective capacitor $310_{0,0}$ to $310_{N,M}$ through a respective data node $308_{0,0}$ to $308_{N,M}$. The other side of each capacitor $310_{0,0}$ to $310_{N,M}$ might be electrically coupled to a common or ground node 312. Bit line pairs of the array of DRAM memory cells 102 might be electrically coupled to respective sensing circuits as will be described below with reference to FIG. 8.

In one example, the array of DRAM memory cells 102 might have a block capacity of 4 kB by 21 bits to provide an 84 kB block capacity with a word size of 21 bits. In an example first option, the array of DRAM memory cells 102 might include 256 word lines (e.g., N=256) and 336 (16 by 21) bit lines (e.g., M=336). In this first option, a substantially even distribution of the array of DRAM memory cells 102 in the X/Y direction might be provided. In an example second option, the array of DRAM memory cells 102 might include 128 word lines (e.g., N=128) and 672 (32 by 21) bit lines (e.g., M=672). In this second option, the bit lines might be shorter in length compared to the first option. Shorter length bit lines might have smaller bit line capacitor loading, thus enabling a shorter refresh cycle time and providing a larger voltage swing resulting in an improved sensing margin. In this second option, however, the area for sensing circuits might be doubled and stronger word line drivers might be needed compared to the first option. In some embodiments, the array of DRAM memory cells 102 might be arranged in an open bit line array structure, where for each sensing circuit, the bit line pairs come from two different array segments. In other embodiments, the array of DRAM memory cells 102 might be arranged in a folded bit line array structure, where for each sensing circuit, the bit line pairs are within the same array segment.

Figure 5:
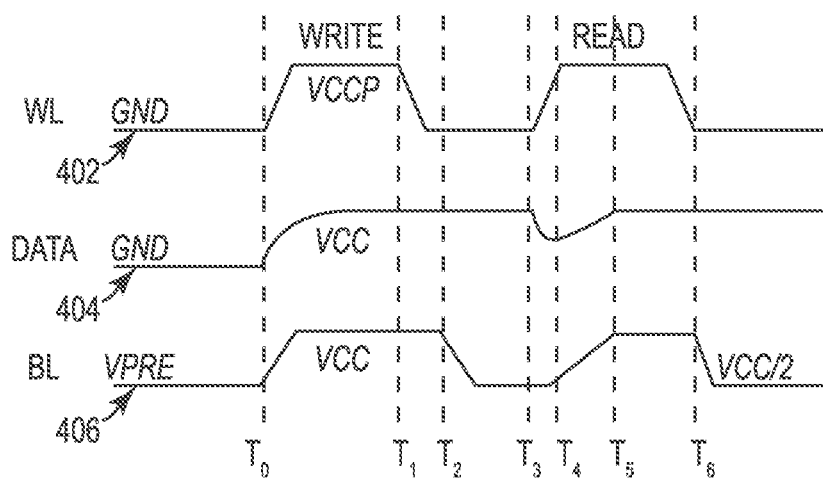
FIG. 5 is a timing diagram illustrating the operation of a DRAM memory cell according to an embodiment.

FIG. 5 is a timing diagram illustrating the operation of a DRAM memory cell, such as a DRAM memory cell $305_{0,0}$ to $305_{N,M}$ of FIG. 4, according to an embodiment. The reading of a DRAM memory cell is destructive, therefore read and refresh operations are used to restore the memory cell state. During a write operation, the respective storage capacitor of a memory cell is charged (for data "1") or discharged (for data "0") by asserting the corresponding word line and the corresponding bit line. During a read operation, charge redistribution takes place between the selected bit line and the storage capacitor, and the bit line has voltage transition as follows:

$$\Delta V = V\mathit{final} - V\mathit{pre} = \frac{\frac{vcc}{2} * Cbl + vcc * Cs}{Cbl + Cs} - \frac{vcc}{2} = \frac{vcc}{2} * \frac{Cs}{Cbl + Cs}$$

where:
ΔV is the swing voltage on the selected bit line;
Vfinal is the final voltage on the selected bit line;
Vpre is the initial/pre-charged voltage on the selected bit line before the access phase in FIG. 9;
Cbl is the capacitance of the bit line; and
Cs is the capacitance of the storage capacitor.

The voltage swing ΔV might be small (e.g., between about 100-200 mV) so a differential sense amplifier might be used for sensing as described below with reference to FIG. 8.

Trace 402 might represent the voltage level applied to a selected word line (e.g., one of word lines $302_0$ to $302_N$ of FIG. 4), trace 404 might represent the voltage level applied to a respective data node (e.g., a respective one of data nodes $308_{0,0}$ to $308_{N,M}$ of FIG. 4), and trace 406 might represent the voltage level applied to a selected bit line (e.g., one of bit lines $304_0$ to $304_M$ of FIG. 4). Prior to time $T_0$, the voltage level of the selected word line might be at ground (GND), the voltage level of the selected data node might be at GND (for data "0"), and the voltage level applied to the selected bit line might be at a reference voltage VPRE (e.g., VCC/2). To write a "1" into the selected memory cell, at time $T_0$, the voltage level applied to the selected word line might be increased to VCCP (e.g., 3.6V), which might be higher than VCC plus the threshold voltage of the memory cell transistor, and the voltage level applied to the selected bit line might be increased to VCC (e.g., 2.2V). In response, the storage capacitor is charged via the memory cell transistor such that the voltage level of the selected data node is charged to VCC. With the writing complete, at time $T_1$, the voltage level applied to the selected word line might be discharged to GND, and at time $T_2$ the voltage level applied to the selected bit line might be discharged to VPRE.

To read the value stored in the memory cell, at time $T_3$, with the voltage level applied to the selected bit line at VPRE, the voltage level applied to the selected word line might be increased to VCCP, hence the memory cell transistor will be turned on. In response, the charge redistribution will take place between the bit line and the storage capacitor, and the delta voltage on the bit line may be sensed by a differential sense amplifier to determine the state of the memory cell (e.g., "0" or "1"), which is "1" in this example. At time $T_4$, the voltage level of the selected bit line might be increased to VCC. The pull up due to a differential amplifier (described below with reference to FIG. 8) restores the data stored in the memory cell by time $T_5$. At time $T_6$, the sensing and restoration of the memory cell state is complete and the voltage level applied to the selected word line might be discharged to GND and the voltage level applied to the selected bit line might be discharged to VPRE.

Figure 6:
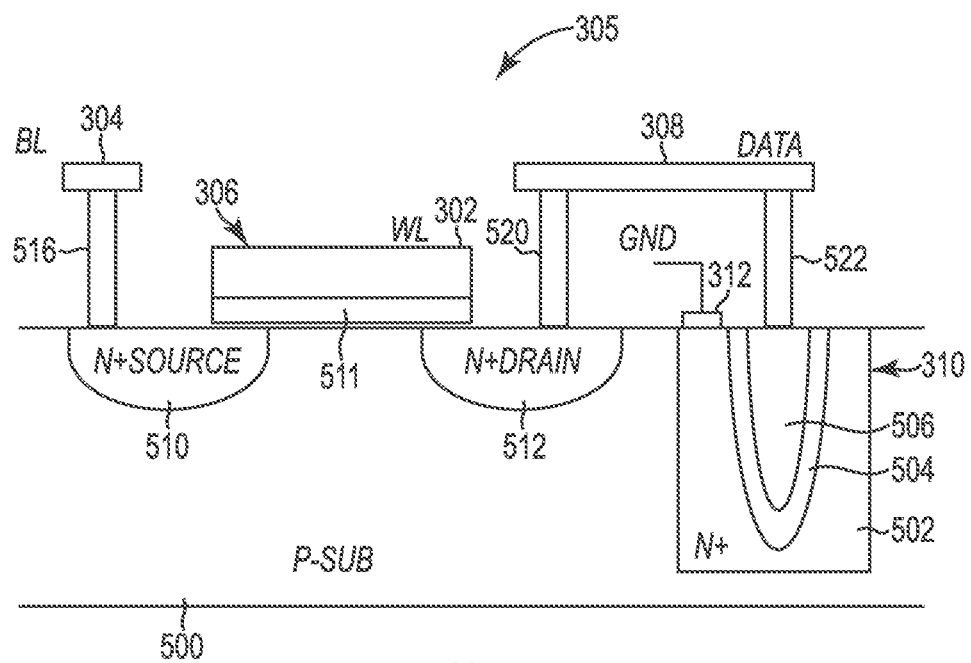
FIG. 6 is a cross-sectional view of a DRAM memory cell according to an embodiment.

FIG. 6 is a cross-sectional view of a DRAM memory cell 305 according to an embodiment. DRAM memory cell 305 includes a word line 302, a bit line 304, a transistor 306, a data node 308, a capacitor 310, and a ground node 312 as previously described with reference to FIG. 4. In this embodiment, capacitor 310 is a trench capacitor. The DRAM memory cell 305 might be fabricated on a p-doped substrate 500. Transistor 306 might include an N+ doped source 510, a polysilicon gate 511, and an N+ doped drain 512. The polysilicon gate 511 of the transistor 306 might be electrically coupled to the word line 302. The bit line 304 might be electrically coupled to the N+ source 510 via a metal layer 516 and a polysilicon contact (not shown). One side of the data node 308 might be electrically connected to the N+ drain 512 via a first metal layer 520 and a first polysilicon contact (not shown) and to one terminal of the trench capacitor 310 via a second metal layer 522 and a polysilicon contact (not shown).

The trench capacitor 310 might be formed in p-doped substrate 500. The trench capacitor 310 might include an N+ well 502, a dielectric layer 504, and a polysilicon layer 506. The other terminal of the trench capacitor 310 might be electrically connected to the ground node 312 via an N+ polysilicon contact (not shown). In one example, the DRAM memory cell 305 might include two trench capacitors electrically connected in parallel to provide capacitor 310. In one embodiment, trench capacitor 310 has fixed dimensions to provide a 7.5 fF (+/−2.5 fF) target value for capacitor 310. In embodiments where two trench capacitors are electrically connected in parallel, capacitor 310 might have a value of 15 fF (+/−5 fF).

Figure 7:
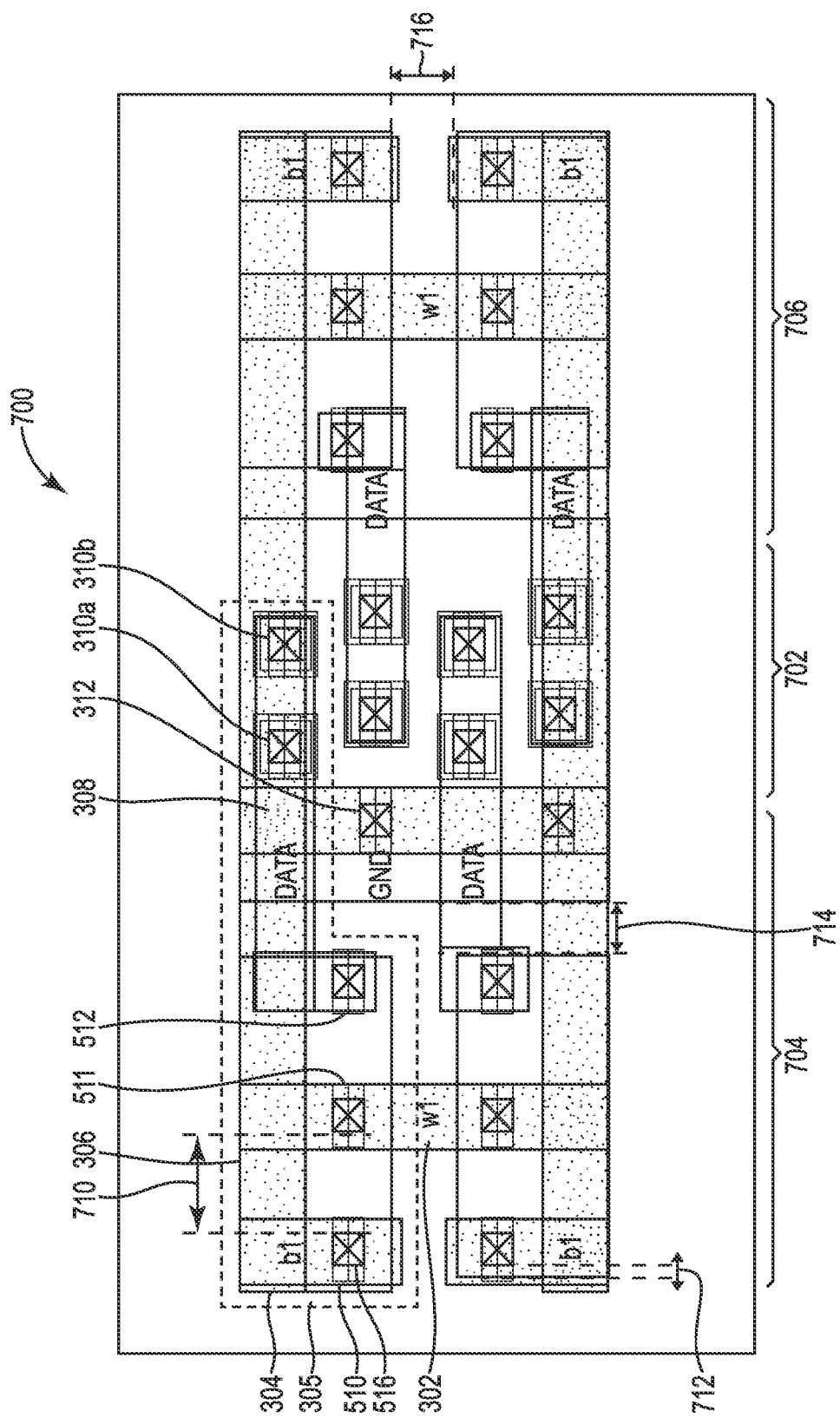
FIG. 7 is a schematic layout diagram illustrating one unit block of an array of DRAM memory cells according to an embodiment.

FIG. 7 is a schematic layout diagram illustrating one unit block 700 of an array of DRAM memory cells 102 according to an embodiment. In this example, each capacitor 310 includes two trench capacitors 310a and 310b electrically coupled in parallel, where a data node 308 is electrically coupled to one terminal of each trench capacitor 310a and 310b and the ground node 312 is electrically coupled to the other terminal of each trench capacitor 310a and 310b. The unit block 700 includes four memory cells 305 (one memory cell is indicated in FIG. 7). Two transistors 306 of the unit block 700 are arranged on a first side (indicated at 704) of eight trench capacitors 310a/310b (indicated at 702) of the unit block, and the other two transistors 306 of the unit block 700 are arranged on a second side (indicated at 706) of the eight trench capacitors 310a/310b of the unit block opposite to the first side.

In one example, the area of unit block 700 might be less than about 1.29 µm². In this case, each transistor 306 might have a width of about 135 nm and a length of about 145 nm. The minimum space design rule 710 between a polysilicon contact (for a vertical connection 516) to a polysilicon gate 511 might be about 167.5 nm. The minimum space design rule 712 between the N+ surround of a polysilicon contact (for a vertical connection 516) might be about 62.5 nm. The minimum space design rule 714 between the N+ space 512 (for a transistor) to the N+ space 502 (for trench capacitors) in the bit line direction might be about 100 nm. The minimum space design rule 716 between the N+ space 512 (for a first transistor) to the N+ space 512 (for an adjacent transistor) in the word line direction might be about 100 nm. In one example, these design rules might result in a DRAM memory having about 5% more area compared to a ROM memory of the same number of memory cells.

In another example, the area of unit block 700 might be less than about 1.17 µm². In this case, each transistor 306 might have a width of about 135 nm and a length of about 145 nm. The minimum space design rule 710 between a polysilicon contact (for a vertical connection 516) to a polysilicon gate 511 might be reduced from about 167.5 nm to about 160 nm. The minimum space design rule 712 between the N+ surround of a polysilicon contact (for a vertical connection 516) might be reduced from about 62.5 nm to about 15 nm. The minimum space design rule 714 between the N+ space 512 (for a transistor) to the N+ space 502 (for trench capacitors) in the bit line direction might be reduced from about 100 nm to about 85 nm. The minimum space design rule 716 between the N+ space 512 (for a first transistor) to the N+ space 512 (for an adjacent transistor) in the word line direction might be reduced from about 100 nm to about 60 nm. In one example, these design rules might result in a DRAM memory having about 5% less area compared to a ROM memory of the same number of memory cells.

In yet another example, the area of unit block 700 might be less than about 1.04 µm². In this case, each transistor 306 might have a width of about 135 nm and a length of about 50 nm. The minimum space design rule 710 between a polysilicon contact (for a vertical connection 516) to a polysilicon gate 511 might be reduced from about 167.5 nm to about 160 nm. The minimum space design rule 712 between the N+ surround of a polysilicon contact (for a vertical connection 516) might be reduced from about 62.5 nm to about 15 nm. The minimum space design rule 714 between the N+ space 512 (for a transistor) to the N+ space 502 (for trench capacitors) in the bit line direction might be reduced from about 100 nm to about 85 nm. The minimum space design rule 716 between the N+ space 512 (for a first transistor) to the N+ space 512 (for another transistor) in the word line direction might be reduced from about 100 nm to about 60 nm. In one example, these design rules might result in a DRAM memory having about 15% less area compared to a ROM memory of the same number of memory cells.

Figure 8:
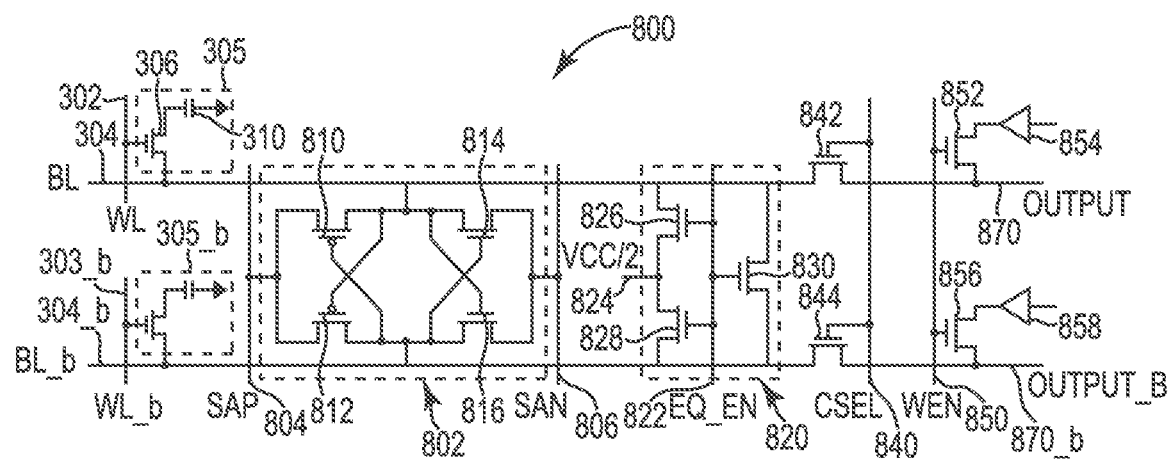
FIG. 8 is a schematic diagram illustrating a sensing/writing circuit of an array of DRAM memory cells according to an embodiment.

FIG. 8 is a schematic diagram illustrating a sensing/writing circuit 800 of an array of DRAM memory cells 102 according to an embodiment. An array of DRAM memory cells 102 might include a plurality of sensing/writing circuits 800, where each sensing/writing circuit 800 is electrically coupled to a bit line pair BL 304 and BL_b 304b of the array of DRAM memory cells 102. During a read operation, bit line 304_b of the bit line pair provides a reference for the selected bit line 304. Sensing/writing circuit 800 might include a sense amplifier circuit 802, a bit line equalizer circuit 820, switch transistors (e.g., NMOS transistors) 842, 844, 852, and 856, and write drivers 854 and 858. Sense amplifier circuit 802 might include transistors (e.g., PMOS transistors) 810 and 812 and transistors (e.g., NMOS transistors) 814 and 816. Bit line equalizer circuit 820 might include transistors (e.g., NMOS transistors) 826, 828, and 830.

A memory cell 305, including a transistor 306 and a capacitor 310, is electrically connected between a bit line 304 and a word line 302. A memory cell 305_b is electrically connected between another bit line 304_b and another word line 302_b. Bit line 304 is electrically connected to one side of the source-drain path of transistors 810, 814, 826, 830, and 842, and to the gates of transistors 812 and 816. Bit line 304_b is electrically connected to one side of the source-drain path of transistors 812, 816, 828, and 844, the other side of the source-drain path of transistor 830, and to the gates of transistors 810 and 814. The other side of the source-drain paths of transistors 810 and 812 are electrically connected to a SAP signal node 804. The other side of the source-drain paths of transistors 814 and 816 are electrically connected to a SAN signal node 806. The other side of the source-drain path of transistors 826 and 828 are electrically connected to a VCC/2 (e.g., VPRE) voltage node 824. The gates of transistors 826, 824, and 830 are electrically connected to an equalizer enable (EQ_EN) signal node 822. The gates of transistors 842 and 844 are electrically connected to a column select (CSEL) signal node 840. The other side of the source-drain path of transistor 842 is electrically connected to one side of the source-drain path of transistor 852 through an output signal path 870. The other side of the source-drain path of transistor 844 is electrically connected to one side of the source-drain path of transistor 856 through an output_b signal path 870_*b*. The gates of transistors 852 and 856 are electrically connected to a write enable (WEN) signal node 850. The other side of the source-drain path of transistor 852 is electrically connected to an output of write driver 854. The other side of the source-drain path of transistor 856 is electrically connected to an output of write driver 858. A controller 106 (FIGS. 1A-3) might control the operation of sensing/writing circuit 800. The operation of sensing/writing circuit 800 is described below with reference to FIG. 9.

Figure 9:
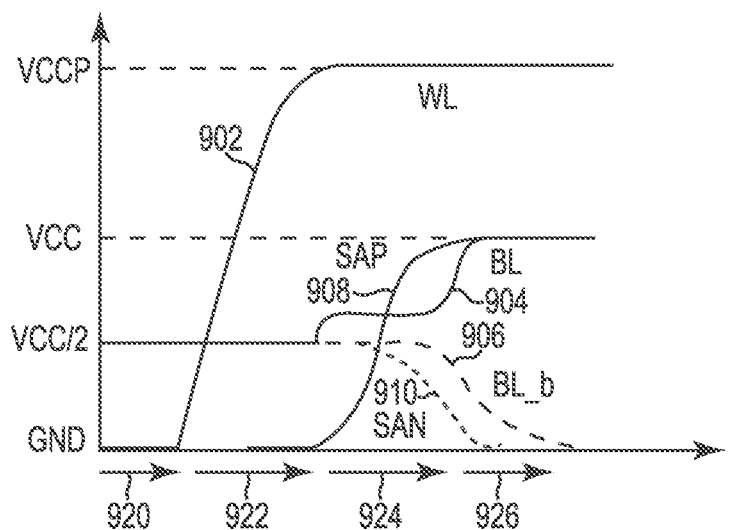
FIG. 9 is a timing diagram illustrating sensing and restoring the state of a DRAM memory cell according to an embodiment.

FIG. 9 is a timing diagram illustrating sensing the state of a DRAM memory cell (e.g., 305 of FIG. 8) and restoring the state of the DRAM memory cell according to an embodiment. Trace 902 might represent the voltage level applied to the word line 302, trace 904 might represent the voltage level applied to the bit line 304, trace 906 might represent the voltage level applied to the bit line 304_*b*, trace 908 might represent the voltage level applied to the SAP signal node 804, and trace 910 might represent the voltage level applied to the SAN signal node 806. During a precharge phase as indicated at 920, the bit line equalizer 820 is activated by biasing the EQ_EN signal node 822 to apply the reference voltage VCC/2 from voltage node 824 to the bit lines 304 and 304_*b*. Also during the precharge phase, the SAP signal node 804 is biased to GND and the SAN signal node 806 is biased to VCC/2.

During an access phase as indicated at 922, the selected word line 302 is overdriven to VCCP to turn on the memory cell transistor 306 to enable charge sharing between the storage capacitor 310 and the bit line 304. If the memory cell stores a digital value of "1" (as in the example of FIG. 9), the voltage of the bit line 304 increases to a voltage above VCC/2 (e.g., VPRE+). If the memory cell stores a digital value of "0", the voltage of the bit line 304 decreases to a voltage below VCC/2 (e.g., VPRE−).

During a sense phase as indicated at 924, the SAN signal node 806 is pulled towards GND and the SAP signal node 804 is pulled towards VCC. The small voltage difference between the bit line 304 and the bit line 304_*b* is then amplified by the cross-connected sense amplifier circuit 802. The voltage level of the bit line 304 and the voltage level of the bit line 304_*b* are driven to complementary maximum and minimum voltage levels (e.g., VCC and GND). The CEL signal node 840 is then biased to turn on the output transistors 842 and 844, so that the voltage level on the bit line 304 and the voltage level on bit line 304_*b* may be read out of the sensing/writing circuit 800 on output signal path 870 and output_b signal path 870_*b*, respectively. During a restore phase as indicated at 926, after the bit lines 304 and 304_*b* reach their maximum and minimum voltage levels (e.g., VCC and GND), the overdriven memory cell transistor 306 remains active, and the fully driven bit line voltage now restores (discharges if content is "0") the charge in the storage capacitor 310.

To write data to memory cell 305, the bit lines 304 and 304_*b* are precharged as indicated at 920. The bit lines 304 and 304_*b* are then pulsed up or down by the sense amplifier circuit 802 according to the original contents of the memory cell. The CSEL signal node 840 and the WEN signal node 850 are then biased to enable the write driver 854 to overdrive the sense amplifier circuit 802 to write the desired value of "0" or "1" in the storage capacitor 310 by charging or discharging the storage capacitor 310.

Since the storage capacitor 310 of a memory cell slowly discharges due to leakage, the memory cell is periodically refreshed to maintain its state by reading the memory cell, which includes the precharge phase 920, access phase 922, sense phase 924, and restore phase 926 described above, except that the CSEL signal node 840 might remain biased to keep output transistors 842 and 844 turned off. A refresh operation might refresh all the memory cells in the same row (e.g., connected to the same word line) at once. During a refresh operation, normal read/write operations for the part of the DRAM memory that is being refreshed are blocked.

Figure 10A:
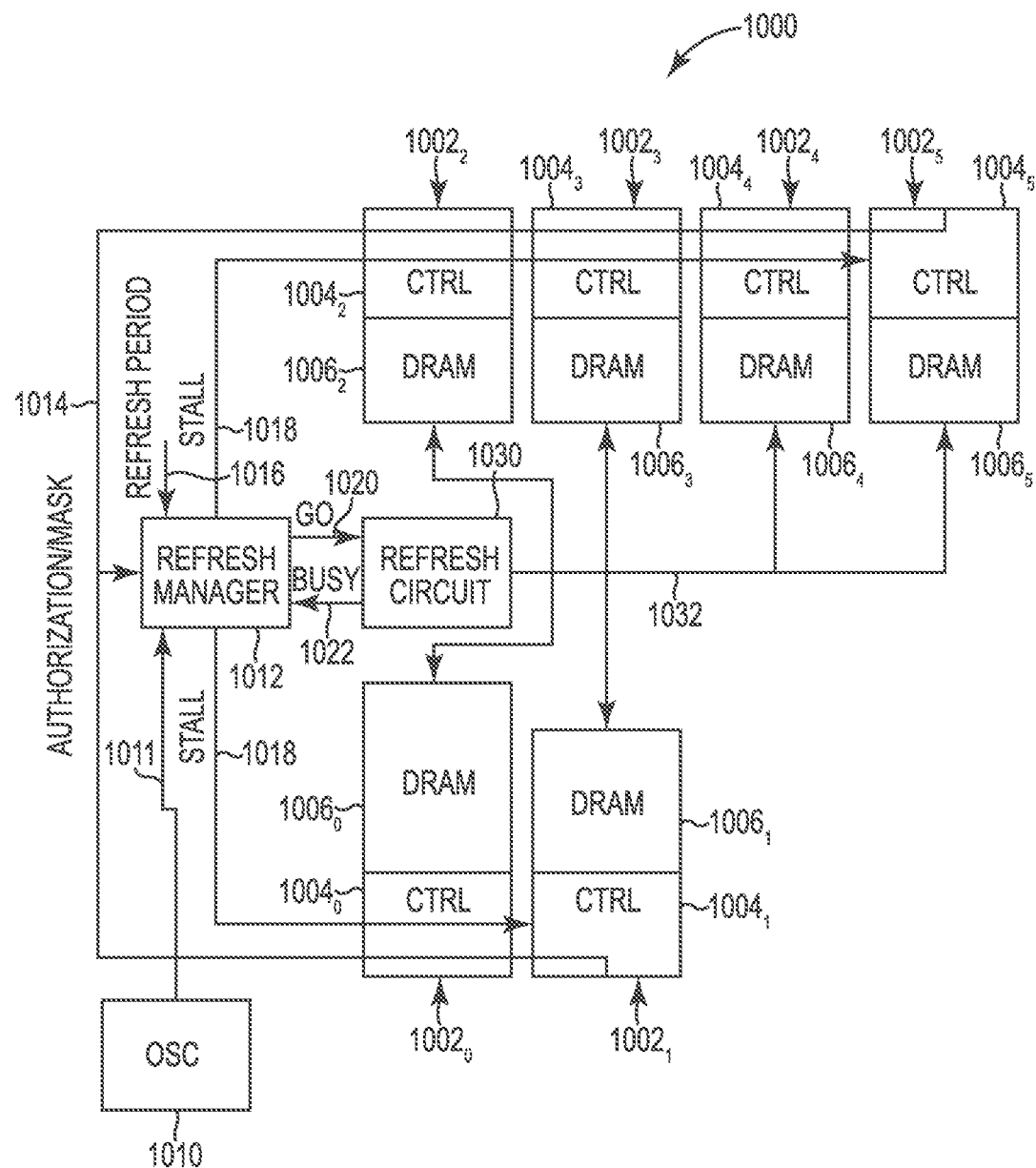
FIG. 10A is a simplified block diagram illustrating a centralized architecture for refresh control of a memory device according to an embodiment.

FIG. 10A is a simplified block diagram illustrating a centralized architecture 1000 for refresh control of a memory device according to an embodiment. The architecture 1000 might include a plurality of control circuits $1002_0$ to $1002_5$, an oscillator (e.g., a low power oscillator) 1010, a refresh manager 1012, and a refresh circuit 1030. In this example, control circuit $1002_0$ may be a main control circuit to control the overall operations of the memory device, control circuit $1002_1$ may be a supplementary control circuit to control other operations of the memory device, and control circuits $1002_2$ to $1002_5$ may be memory plane control circuits to control access to respective memory planes of the array of flash memory cells 104. While four control circuits $1002_2$ to $1002_5$ to control access to four memory planes are illustrated in FIG. 10A, in other examples, the architecture 1000 might include any suitable number of control circuits 1002 to control access to any suitable number of memory planes, such as 6, 8, etc. memory planes.

Each control circuit $1002_0$ to $1002_5$ includes a controller $1004_0$ to $1004_5$ and a DRAM memory $1006_0$ to $1006_5$, respectively. In some examples, DRAM memory $1006_0$ might have a larger capacity than DRAM memory $1006_1$, and DRAM memory $1006_1$ might have a larger capacity than each of DRAM memories $1006_2$ to $1006_5$, which might have the same capacity. An output of the oscillator 1010 might be electrically connected to a first input of the refresh manager 1012 through a signal path 1011. A second input of refresh manager 1012 might receive a refresh period on a signal path 1016. An output of each controller $1004_0$ to $1004_5$ might be electrically connected to a third input of refresh manager 1012 through authorization/mask signal paths 1014. An input of each controller $1004_0$ to $1004_5$ might be electrically connected to a first output of refresh manager 1012 through a stall signal path 1018. A second output of refresh manager 1012 might be electrically connected to an input of refresh circuit 1030 through a go signal path 1020. A third input of refresh manager 1012 might be electrically connected to a first output of refresh circuit 1030 through a busy signal path 1022. A second output of refresh circuit 1030 might be electrically connected to an input of each DRAM memory $1006_0$ to $1006_5$ through signal paths 1032.

In one example, architecture 1000 might be part of control logic 126 (FIG. 2) to access the array of flash memory cells 104. Each controller $1004_0$ to $1004_5$ might be similar to controller 106 and each DRAM memory $1006_0$ to $1006_5$ might be similar to the array of DRAM memory cells 102 previously described and illustrated with reference to FIGS. 1A-3. Each controller $1004_0$ to $1004_5$ might be configured to execute respective first instructions stored in the respective DRAM memory $1006_0$ to $1006_5$. In one example, as illustrated in FIG. 3, each control circuit $1002_0$ to $1002_5$ might also include a respective array of ROM memory cells. In this case, upon initialization of the memory device, the respective controller $1004_0$ to $1004_5$ might be configured to execute respective second instructions stored in the respective array of ROM memory cells to copy the respective first instructions stored in the array of flash memory cells 104 to the respective DRAM memory $1006_0$ to $1006_5$. In one example, a controller $1004_0$ to $1004_5$ might be configured to update the respective first instructions stored in the array of flash memory cells 104. In this case, upon initialization of the memory device, the controller $1004_0$ to $1004_5$ might be configured to execute the respective second instructions stored in the respective array of ROM memory cells to copy the respective updated first instructions stored in the array of flash memory cells 104 to the respective DRAM memory $1006_0$ to $1006_5$.

The DRAM memories $1006_0$ to $1006_5$ are periodically refreshed to preserve the content of the DRAM memory cells. In one example, half of each DRAM memory $1006_0$ to $1006_5$ might be refreshed in less than about 1 μs and the refresh interval might be less than about 6 ms. While a controller $1004_0$ to $1004_5$ is currently executing instructions, the refresh of the respective DRAM memory $1006_0$ to $1006_5$ should be avoided to prevent execution errors. When a controller $1004_0$ to $1004_5$ is not currently executing instructions, which might be referred to as a stall, the respective DRAM memory $1006_0$ to $1006_5$ may be refreshed without generating execution errors. A DRAM memory $1006_0$ to $1006_5$ may be also refreshed without generating execution errors when the respective controller $1004_0$ to $1004_5$ is in a sleep phase. Therefore, each respective controller $1004_0$ to $1004_5$ might be configured to set a mask bit on an authorization/mask signal path 1014 in response to the respective controller $1004_0$ to $1004_5$ not being stalled. Each respective controller $1004_0$ to $1004_5$ might also be configured to set the mask bit on the authorization/mask signal path 1014 in response to the respective controller $1004_0$ to $1004_5$ executing critical instructions that should not be stalled. The refresh manager 1012 might be configured to periodically generate a refresh request and generate a refresh go signal on go signal path 1020 in response to the refresh request and an unset mask bit from each controller $1004_0$ to $1004_5$. The refresh circuit 1030 might be configured to refresh the DRAM memory $1006_0$ to $1006_5$ of each control circuit $1002_0$ to $1002_5$ in response to the go signal on signal path 1020. While refresh circuit 1030 is refreshing the DRAM memories $1006_0$ to $1006_5$, refresh circuit 1030 might generate a busy signal on busy signal path 1022.

There may be many sleep phases during the execution of the instructions by the controllers $1004_0$ to $1004_5$. Thus, each respective controller $1004_0$ to $1004_5$ might be configured to set a respective authorization bit on an authorization/mask signal path 1014 in response to the respective controller $1004_0$ to $1004_5$ being in a sleep phase. The refresh manager 1020 might be configured to generate the refresh go signal on refresh go signal path 1020 in response to the respective authorization bit being set for all the respective controllers $1004_0$ to $1004_5$. Therefore in this case, the refresh manager 1020 might not wait for a refresh request. In this way, execution of critical instructions by controllers $1004_0$ to $1004_5$ are less likely to be impacted since the refresh operation is favored in the waiting or non-critical phases of instruction execution.

The refresh manager 1012 might count the events generated by the oscillator 1010, and based on the refresh period input on signal path 1016, generate a refresh request to launch the refresh circuit 1030 when needed. In response to the refresh go signal on signal path 1020, the refresh circuit 1030 processes the refresh go signal and an internal counter sends addresses and other control logic signals to DRAM memories $1006_0$ to $1006_5$, which physically execute the refresh operation row by row until half of the capacity of each memory is refreshed within one refresh cycle. The refresh manager 1012 may force a stall of all controllers $1004_0$ to $1004_5$ via signal path 1018 while the refresh operation is active (as indicated by the busy signal on signal path 1022). There may be some critical firmware routines that should not be stalled. Therefore, in some embodiments, the refresh period may be set smaller than a maximum allowable refresh period to enable the refresh manager 1012 to postpone the refresh operation in the case of a mask signal being set. The refresh operation cannot be postponed forever, however, so the refresh manager 1012 may launch a watchdog timer. If the watchdog timer expires and the mask has not been unset, the controllers $1004_0$ to $1004_5$ might be forced to stall, the refresh operation might be implemented by refresh circuit 1030, and the currently executing operation might exit with an error as described in more detail below with reference to FIG. 10B.

Figure 10B:
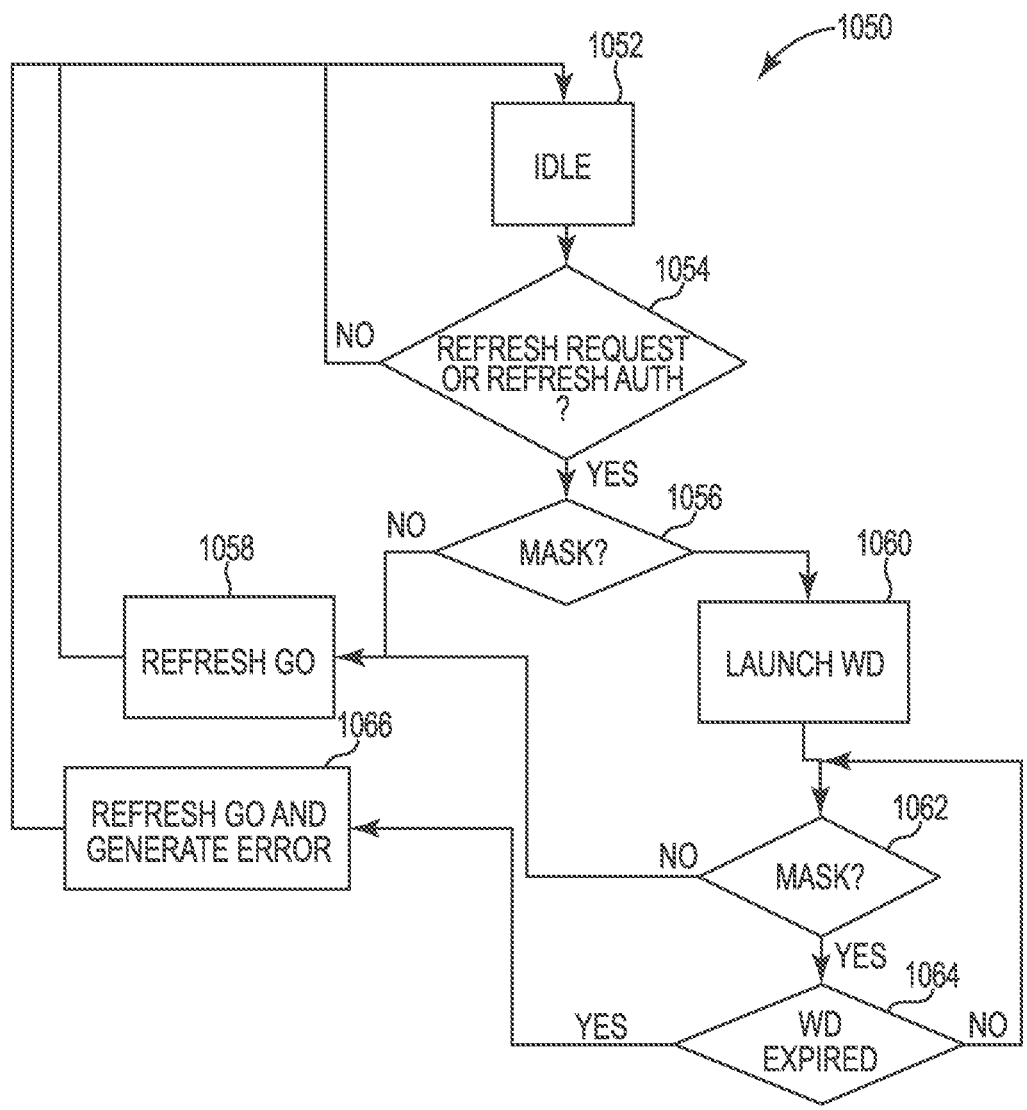
FIG. 10B is a flow diagram illustrating a method for operating centralized DRAM refresh control of FIG. 10A according to an embodiment.

FIG. 10B is a flow diagram illustrating a method 1050 for operating centralized DRAM refresh control of FIG. 10A according to an embodiment. At 1052, the refresh manager 1012 is in an idle state. At 1054, the refresh manager 1012 determines whether a refresh request has been generated (e.g., count of events from oscillator 1010 equals the refresh period) or the respective authorization bit is set for all the respective controllers $1004_0$ to $1004_5$. If a refresh request has not been generated and the respective authorization bits have not been set, then the refresh manager 1012 returns to the idle state at 1052. If a refresh request has been generated or the respective authorization bits have been set, at 1056, the refresh manager 1012 determines whether a mask bit (indicating a controller $1004_0$ to $1004_5$ should not be stalled) is set. If no mask bit is set, then at 1058 the refresh manager 1012 generates the refresh go signal, and each DRAM memory $1006_0$ to $1006_5$ is refreshed by refresh circuit 1030. The refresh manager 1012 then returns to the idle state at 1052.

If a mask bit is set, then at 1060 the refresh manager 1012 launches a watchdog timer. While the watchdog timer is running, at 1062 the refresh manager determines whether the mask bit remains set. If the mask bit has become unset, then at 1058 the refresh manager 1012 generates the refresh go signal, each DRAM memory $1006_0$ to $1006_5$ is refreshed by refresh circuit 1030, the refresh manager 1012 cancels the watchdog timer and returns to the idle state at 1052. In response to the mask bit remaining set, at 1064 the refresh manager determines whether the watchdog timer has expired. If the watchdog timer has not expired, the refresh manager returns to 1062 to again determine whether the set mask bit remains set. If the watchdog timer has expired, then at 1066 the refresh manager 1012 forces a stall of each controller $1004_0$ to $1004_5$, which results in an error being generated by the controller(s) forced to stall, the refresh manager 1012 generates the refresh go signal, and each DRAM memory $1006_0$ to $1006_5$ is refreshed by refresh circuit 1030. The refresh manager 1012 then returns to the idle state at 1052.

Thus, the refresh manager 1012 starts a watchdog timer in response to a refresh request and a set mask bit. The refresh manager 1012 generates the refresh go signal in response to the mask signal transitioning to unset prior to the watchdog timer expiring. In response to the watchdog timer expiring, the refresh manager 1012 forces a stall of each respective controller $1004_0$ to $1004_5$ and generates the refresh go signal.

Figure 11A:
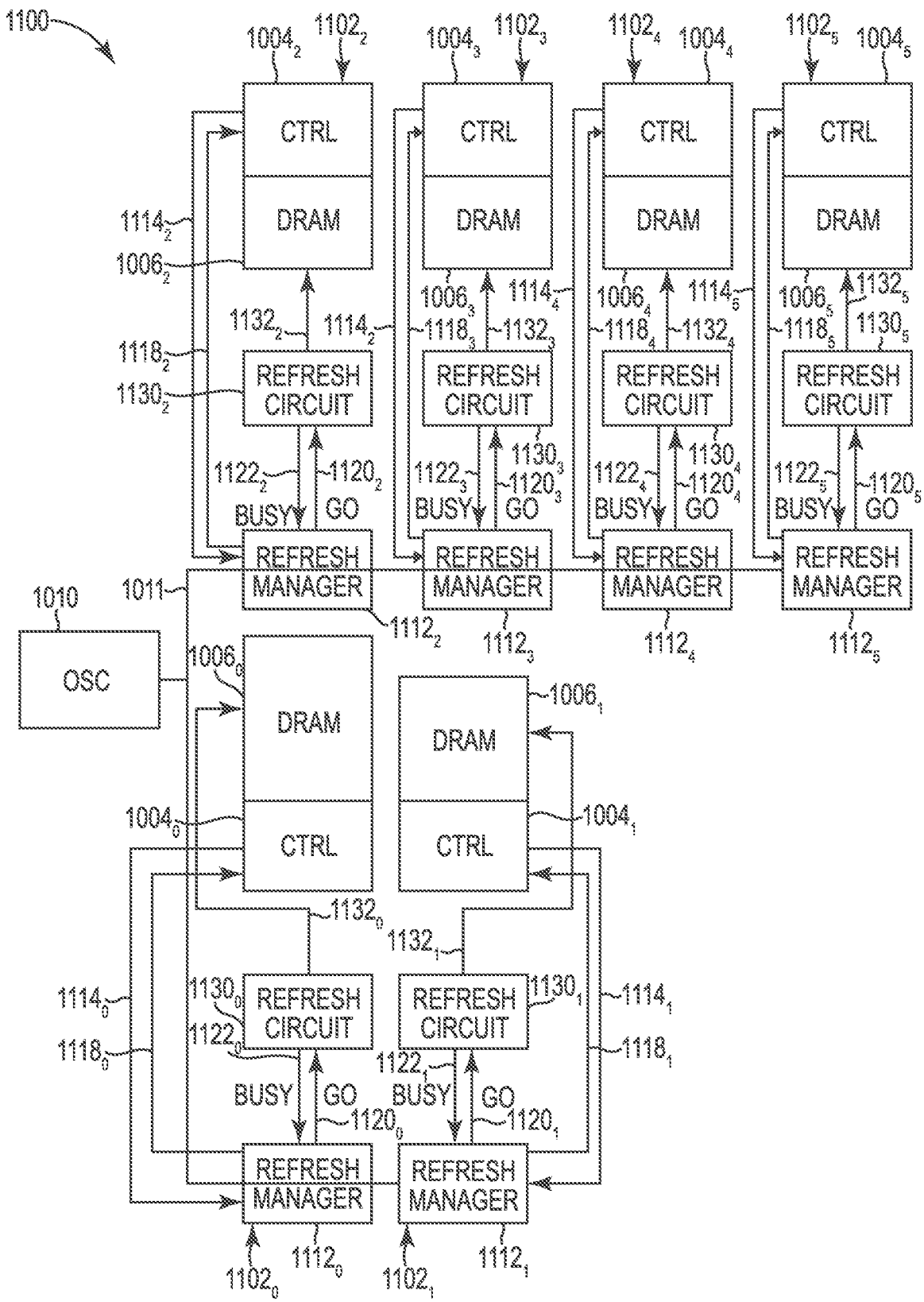
FIG. 11A is a simplified block diagram illustrating a distributed architecture for refresh control of a memory device according to an embodiment.

FIG. 11A is a simplified block diagram illustrating a distributed architecture 1100 for refresh control of a memory device according to an embodiment. The architecture 1100 might include a plurality of control circuits $1102_0$ to $1102_5$ and an oscillator (e.g., a low power oscillator) 1010. In this example, control circuit $1102_0$ may be a main control circuit to control the overall operations of the memory device, control circuit $1102_1$ may be a supplementary control circuit to control other operations of the memory device, and control circuits $1102_2$ to $1102_5$ may be memory plane control circuits to control access to respective memory planes of the array of flash memory cells 104. While four control circuits $1102_2$ to $1102_5$ to control access to four memory planes are illustrated in FIG. 11A, in other examples, the architecture 1100 might include any suitable number of control circuits 1102 to control access to any suitable number of memory planes, such as 6, 8, etc. memory planes.

Each control circuit $1102_0$ to $1102_5$ includes a controller $1004_0$ to $1004_5$, a DRAM memory $1006_0$ to $1006_5$, a refresh manager $1112_0$ to $1112_5$, and a refresh circuit $1130_0$ to $1130_5$, respectively. An output of the oscillator 1010 might be electrically connected to a first input of each refresh manager $1112_0$ to $1112_5$ through a signal path 1011. A second input (not shown) of each refresh manager $1112_0$ to $1112_5$ might receive a refresh period (e.g., as illustrated by refresh period signal path 1016 of FIG. 10A). An output of each controller $1004_0$ to $1004_5$ is electrically connected to a second input of each refresh manager $1112_0$ to $1112_5$ through an authorization/mask signal path $1114_0$ to $1114_5$, respectively. An input of each controller $1004_0$ to $1004_5$ might be electrically connected to a first output of each refresh manager $1112_0$ to $1112_5$ through a stall signal path $1118_0$ to $1118_5$, respectively. A second output of each refresh manager $1112_0$ to $1112_5$ might be electrically connected to an input of each refresh circuit $1130_0$ to $1130_5$ through a go signal path $1120_0$ to $1120_5$, respectively. A third input of each refresh manager $1112_0$ to $1112_5$ might be electrically connected to a first output of each refresh circuit $1130_0$ to $1130_5$ through a busy signal path $1122_0$ to $1122_5$, respectively. A second output of each refresh circuit $1130_0$ to $1130_5$ might be electrically connected to an input of each DRAM memory $1006_0$ to $1006_5$ through a signal path $1132_0$ to $1132_5$, respectively.

In one example, architecture 1100 might be part of control logic 126 (FIG. 2) to access the array of flash memory cells 104. Each controller $1004_0$ to $1004_5$ might be configured to execute respective first instructions stored in the respective DRAM memory $1006_0$ to $1006_5$. In one example, as illustrated in FIG. 3, each control circuit $1102_0$ to $1102_5$ might also include a respective array of ROM memory cells. In this case, upon initialization of the memory device, the respective controller $1004_0$ to $1004_5$ might be configured to execute respective second instructions stored in the respective array of ROM memory cells to copy the respective first instructions stored in the array of flash memory cells 104 to the respective DRAM memory $1006_0$ to $1006_5$. In one example, a controller $1004_0$ to $1004_5$ might be configured to update the respective first instructions stored in the array of flash memory cells 104. In this case, upon initialization of the memory device, the controller $1004_0$ to $1004_5$ might be configured to execute the respective second instructions stored in the respective array of ROM memory cells to copy the respective updated first instructions stored in the array of flash memory cells 104 to the respective DRAM memory $1006_0$ to $1006_5$.

The DRAM memories $1006_0$ to $1006_5$ are periodically refreshed to preserve the content of the DRAM memory cells. While a controller $1004_0$ to $1004_5$ is currently executing instructions, the refresh of the respective DRAM memory $1006_0$ to $1006_5$ should be avoided to prevent execution errors. When a controller $1004_0$ to $1004_5$ is not currently executing instructions, which might be referred to as a stall, the respective DRAM memory $1006_0$ to $1006_5$ may be refreshed without generating execution errors. Therefore, each respective controller $1004_0$ to $1004_5$ might be configured to set a mask bit on the respective authorization/mask signal path $1114_0$ to $1114_5$ in response to the respective controller $1004_0$ to $1004_5$ not being stalled. Each refresh manager $1102_0$ to $1102_5$ might be configured to periodically generate a refresh request and generate a refresh go signal on the respective go signal path $1120_0$ to $1120_5$ in response to the respective refresh request and a respective unset mask bit from each respective controller $1004_0$ to $1004_5$. Each refresh circuit $1130_0$ to $1130_5$ might be configured to refresh the respective DRAM memory $1006_0$ to $1006_5$ of each respective control circuit $1002_0$ to $1002_5$ in response to the go signal on the respective signal path $1120_0$ to $1120_5$. While each refresh circuit $1130_0$ to $1130_5$ is refreshing the respective DRAM memory $1006_0$ to $1006_5$, the respective refresh circuit $1130_0$ to $1130_5$ might generate a busy signal on the respective busy signal path $1122_0$ to $1122_5$.

Each refresh manager $1112_0$ to $1112_5$ might count the events generated by the oscillator 1010 and based on the refresh period, generate a refresh request to launch the respective refresh circuit $1130_0$ to $1130_5$ when needed. In response to the refresh go signal on the respective signal path $1120_0$ to $1120_5$, each refresh circuit $1130_0$ to $1130_5$ processes the respective refresh go signal and an internal counter sends addresses and other control logic signals to the respective DRAM memory $1006_0$ to $1006_5$, which physically executes the refresh operation row by row until half of the capacity of the respective memory is refreshed within one refresh cycle. Each refresh manager $1102_0$ to $1102_5$ may force a stall of the respective controller $1004_0$ to $1004_5$ via the respective signal path $1118_0$ to $1118_5$ while the refresh operation is active (as indicated by the busy signal on the respective signal path $1122_0$ to $1122_5$). Each refresh manager $1102_0$ to $1102_5$ might refresh the respective DRAM memory $1006_0$ to $1006_5$ during stalls of the respective controller $1004_0$ to $1004_5$. During the refresh-during-stalls, each refresh manager $1102_0$ to $1102_5$ may launch a respective watchdog timer. If stalls of the respective controller $1004_0$ to $1004_5$ are not enough time to complete the refresh operation and the respective watchdog timer expires, the respective controller $1004_0$ to $1004_5$ might be forced to stall, the refresh operation might be completed by the respective refresh circuit $1130_0$ to $1130_5$, and the currently executing operation might exit with an error as described in more detail below with reference to FIG. 11B.

Figure 11B:
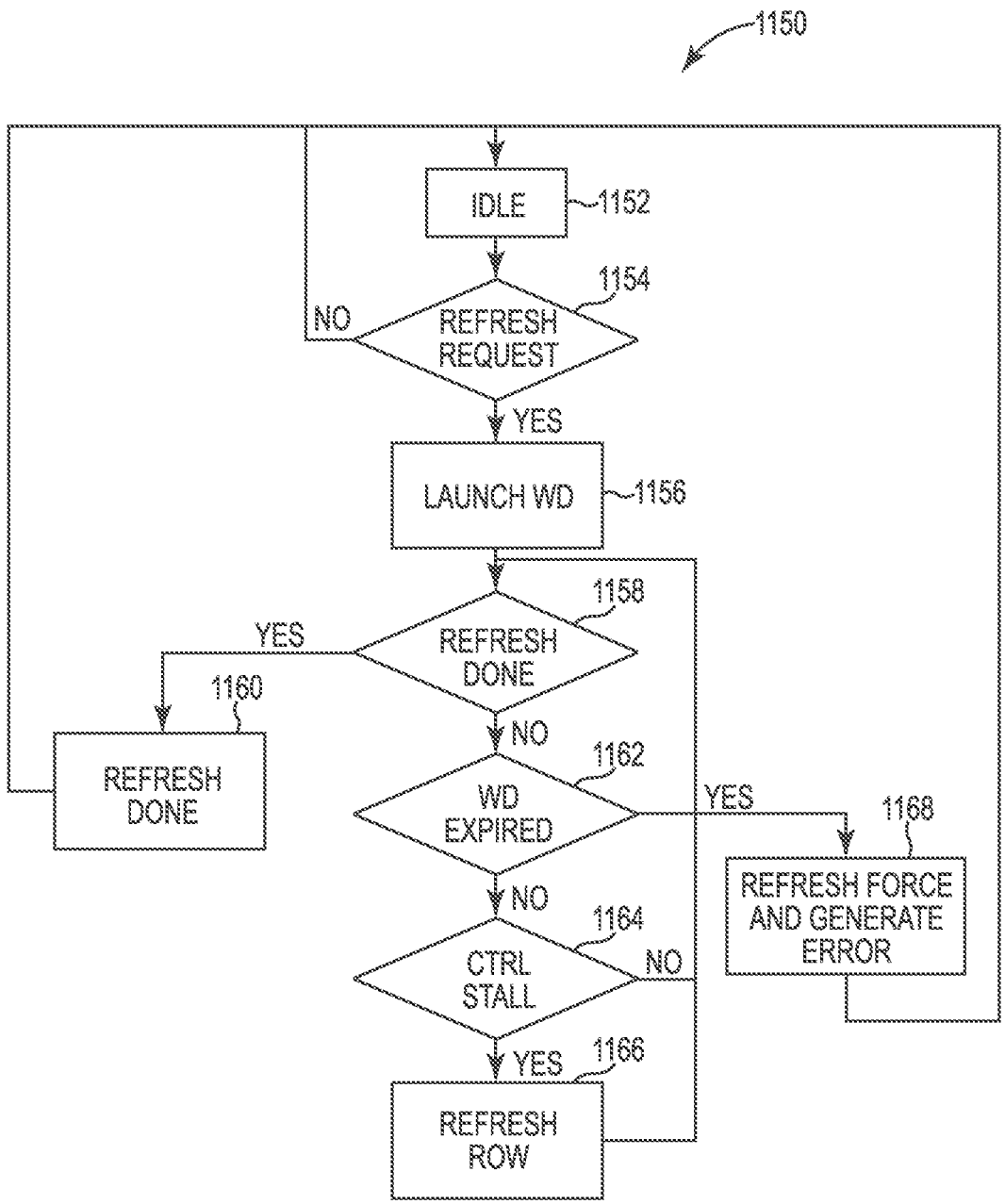
FIG. 11B is a flow diagram illustrating a method for operating distributed DRAM refresh control of FIG. 11A according to an embodiment.

FIG. 11B is a flow diagram illustrating a method 1150 for operating distributed DRAM refresh control of FIG. 11A according to an embodiment. Method 1150 individually applies to each control circuit $1102_0$ to $1102_5$ of FIG. 11A. At 1152, the refresh manager 1112 (of a control circuit $1102_0$ to $1102_5$) is in an idle state. At 1154, the refresh manager 1112 determines whether a refresh request has been generated (e.g., count of events from oscillator 1010 equals the refresh period). If a refresh request has not been generated, the refresh manager 1112 returns to the idle state at 1152. If a refresh request has been generated, the refresh manager 1112 launches a watchdog timer at 1156. At 1158, the refresh manager 1112 determines whether the refresh operation is complete. If the refresh operation is complete, then at 1160 the refresh manager 1112 cancels the watchdog timer and returns to the idle state at 1152. If the refresh operation is not complete, then at 1162 the refresh manager 1112 determines whether the watchdog timer has expired. If the watchdog timer has not expired, then the refresh manager 1112 determines whether the controller 1004 is stalled (e.g., by checking the authorization/mask bit). If the controller 1004 is not stalled, the refresh manager 1112 returns to 1158 to determine whether the refresh operation is complete. If the controller 1004 is stalled, the refresh manager 1112 refreshes the next row of the DRAM memory 1006 at 1166 and returns to 158 to determine whether the refresh operation is complete. If the watchdog timer has expired, then at 1168 the refresh manager 1112 forces the completion of the refresh operation by forcing a stall of the controller 1004, which results in an error being generated by the controller 1004, and completes the refresh operation. The refresh manager 1112 then returns to the idle state at 1152.

Thus, each respective refresh manager $1112_0$ to $1112_5$ might be configured to periodically receive a refresh request and start a watchdog timer in response to the refresh request. The respective refresh circuit $1130_0$ to $1130_5$ might be configured to refresh the respective array of DRAM memory cells $1006_0$ to $1006_5$ during stalls of the respective controller $1004_0$ to $1004_5$ and with the watchdog timer not expired. Each respective refresh circuit $1130_0$ to $1130_5$ for each control circuit $1102_0$ to $1102_5$ might be configured to force a stall of the respective controller $1004_0$ to $1004_5$ and refresh the respective array of DRAM memory cells $1006_0$ to $1006_5$ in response to the watchdog timer expiring.

CONCLUSION

Although specific embodiments have been illustrated and described herein, it will be appreciated by those of ordinary skill in the art that any arrangement that is calculated to achieve the same purpose may be substituted for the specific embodiments shown. Many adaptations of the embodiments will be apparent to those of ordinary skill in the art. Accordingly, this application is intended to cover any adaptations or variations of the embodiments.

What is claimed is:

1. A memory device comprising:
an array of flash memory cells;
an array of Dynamic Random Access Memory (DRAM) memory cells;
an instruction set address space comprising the array of DRAM memory cells; and
a controller configured to:
load/store, in the array of DRAM memory cells, first instructions for accessing the array of flash memory cells; and
access the instruction set address space to execute the loaded/stored first instructions in the array of DRAM memory cells to perform an access operation in the array of flash memory cells in response to address signals and control signals for accessing the array of flash memory cells from an external host device.

2. The memory device of claim 1, further comprising:
an array of Read Only Memory (ROM) memory cells, wherein, upon initialization of the memory device, the controller is configured to execute second instructions stored in the array of ROM memory cells to copy the first instructions stored in the array of flash memory cells to the array of DRAM memory cells.

3. The memory device of claim 2, wherein the controller is configured to:
update the first instructions stored in the array of flash memory cells, and
upon initialization of the memory device, to execute the second instructions stored in the array of ROM memory cells to copy the updated first instructions stored in the array of flash memory cells to the array of DRAM memory cells.

4. The memory device of claim 1, wherein the controller is configured to enable a refresh of the array of DRAM memory cells to preserve the content of the array of DRAM memory cells.

5. The memory device of claim 1, wherein the controller is configured to set a mask bit in response to the controller not being stalled, the memory device further comprising:
a refresh manager configured to periodically receive a refresh request and generate a refresh go signal in response to the refresh request and an unset mask bit; and
a refresh circuit configured to refresh the array of DRAM memory cells in response to the refresh go signal.

6. The memory device of claim 5, wherein the refresh manager is configured to stall the controller while the array of DRAM memory cells is being refreshed.

7. The memory device of claim 5, wherein the refresh manager is configured to:
start a watchdog timer in response to a refresh request and a set mask bit;
generate the refresh go signal in response to the mask signal transitioning to unset prior to the watchdog timer expiring; and
in response to the watchdog timer expiring, force a stall of the controller and generate the refresh go signal.

8. The memory device of claim 7, wherein in response to the refresh manager forcing a stall of the controller, the controller is configured to exit a current operation and return an error code.

9. The memory device of claim 5, wherein the controller is configured to set an authorization bit in response to the controller being in a sleep phase, and
wherein the refresh manager is configured to generate the refresh go signal in response to the authorization bit being set.

10. The memory device of claim 1, wherein the controller is configured to:
load/store, in the array of DRAM memory cells, the first instructions for accessing the array of flash memory cells for read, write, and/or erase operations; and
access the instruction set address space to execute the loaded/stored first instructions in the array of DRAM memory cells to perform a read, write, and/or erase operation in the array of flash memory cells.

11. A memory device comprising:
a NAND memory array;
a Dynamic Random Access Memory (DRAM) memory array;
an instruction set address space comprising the DRAM memory array; and
a controller configured to access the instruction set address space to execute first instructions stored in the DRAM memory array to access the NAND memory array in response to address signals and control signals for accessing the NAND memory array from an external host device.

12. The memory device of claim 11, wherein the DRAM memory array comprises:
a plurality of word lines;
a plurality of bit lines; and
a plurality of memory cells,
wherein each memory cell of the plurality of memory cells comprises a transistor and a capacitor, a gate of the transistor electrically coupled to a corresponding word line of the plurality of word lines, a source of the transistor electrically coupled to a corresponding bit line of the plurality of bit lines, and a drain of the transistor electrically coupled to the capacitor.

13. The memory device of claim 12, wherein the capacitor comprises at least one trench capacitor.

14. The memory device of claim 12, wherein the capacitor comprises two trench capacitors electrically coupled in parallel.

15. The memory device of claim 14, wherein the DRAM memory array comprises a plurality of unit blocks, each unit block of the plurality of unit blocks comprising four memory cells of the plurality of memory cells.

16. The memory device of claim 15, wherein two transistors of each unit block are arranged on a first side of eight trench transistors of the unit block, and the other two transistors of each unit block are arranged on a second side of the eight trench transistors of the unit block opposite to the first side.

17. The memory device of claim 15, wherein an area of each unit block of the plurality of unit blocks is less than 166 nm$^2$.

18. A memory device comprising:
an array of flash memory cells; and
control logic configured to access the array of flash memory cells, the control logic comprising a plurality of control circuits, each control circuit comprising:
a respective array of Dynamic Random Access Memory (DRAM) memory cells;
a respective controller configured to execute respective first instructions stored in the respective array of DRAM memory cells; and
a respective array of Read Only Memory (ROM) memory cells,
wherein, upon initialization of the memory device, the respective controller is configured to execute respective second instructions stored in the respective array of ROM memory cells to copy the respective first instructions stored in the array of flash memory cells to the respective array of DRAM memory cells.

19. The memory device of claim 18, wherein the respective controller is configured to:
update the respective first instructions stored in the array of flash memory cells, and
upon initialization of the memory device, execute the respective second instructions stored in the respective array of ROM memory cells to copy the respective updated first instructions stored in the array of flash memory cells to the respective array of DRAM memory cells.

20. The memory device of claim 18, wherein each respective controller is configured to set a mask bit in response to the respective controller not being stalled, the memory device further comprising:
a refresh manager configured to periodically receive a refresh request and generate a refresh go signal in response to the refresh request and an unset mask bit; and
a refresh circuit configured to refresh the respective array of DRAM memory cells of each control circuit in response to the refresh go signal.

21. The memory device of claim 20, wherein the refresh manager is configured to:
start a watchdog timer in response to a refresh request and a set mask bit;
generate the refresh go signal in response to the mask signal transitioning to unset prior to the watchdog timer expiring; and
in response to the watchdog timer expiring, force a stall of each respective controller and generate the refresh go signal.

22. The memory device of claim 20, wherein each respective controller is configured to set a respective authorization bit in response to the respective controller being in a sleep phase, and
wherein the refresh manager is configured to generate the refresh go signal in response to the respective authorization bit being set for each respective controller.

23. The memory device of claim 18, wherein each respective control circuit further comprises:
a respective refresh manager configured to periodically receive a refresh request and start a watchdog timer in response to the refresh request; and
a respective refresh circuit configured to refresh the respective array of DRAM memory cells during stalls of the respective controller and with the watchdog timer not expired.

24. The memory device of claim 23, wherein the respective refresh circuit for each control circuit is further configured to force a stall of the respective controller and refresh the respective array of DRAM memory cells in response to the watchdog timer expiring.

* * * * *